(12) United States Patent
Shiraiwa et al.

(10) Patent No.: US 7,033,957 B1
(45) Date of Patent: *Apr. 25, 2006

(54) ONO FABRICATION PROCESS FOR INCREASING OXYGEN CONTENT AT BOTTOM OXIDE-SUBSTRATE INTERFACE IN FLASH MEMORY DEVICES

(75) Inventors: Hidehiko Shiraiwa, San Jose, CA (US); Tazrien Kamal, San Jose, CA (US); Mark Ramsbey, Sunnyvale, CA (US); Inkuk Kang, Saratoga, CA (US); Jaeyong Park, Sunnyvale, CA (US); Rinji Sugino, San Jose, CA (US); Jean Y. Yang, Sunnyvale, CA (US); Fred T K Cheung, San Jose, CA (US); Arvind Halliyal, Cupertino, CA (US); Amir H. Jafarpour, Pleasanton, CA (US)

(73) Assignee: FASL, LLC, Sunnvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 37 days.

This patent is subject to a terminal disclaimer.

(21) Appl. No.: 10/358,586

(22) Filed: Feb. 5, 2003

(51) Int. Cl.
*H01L 21/31* (2006.01)

(52) U.S. Cl. ..................... 438/770; 438/954

(58) Field of Classification Search ............... 438/216, 438/257, 261, 287, 591, 954, 769, 770; 257/324
See application file for complete search history.

(56) References Cited

U.S. PATENT DOCUMENTS

| 4,784,975 | A | 11/1988 | Hofmann et al. | 437/247 |
|---|---|---|---|---|
| 6,015,717 | A | 1/2000 | Tripsas | 438/16 |
| 6,236,064 | B1 | 5/2001 | Mase et al. | 257/72 |
| 6,271,151 | B1 | 8/2001 | Wollesen | 438/770 |
| 6,281,142 | B1 | 8/2001 | Basceri et al. | 438/771 |
| 6,337,237 | B1 | 1/2002 | Basceri et al. | 438/239 |
| 6,348,380 | B1 | 2/2002 | Weimer et al. | 438/257 |
| 6,395,654 | B1 | 5/2002 | Yang et al. | 438/954 |

(Continued)

OTHER PUBLICATIONS

Lenahan; "Radiation-Induced Leakage Currents: Atomic Scale Mechanisms"; IEEE Transactions on Nuclear Science; vol. 48, No. 6, Dec. 2001.

(Continued)

*Primary Examiner*—David Vu
(74) *Attorney, Agent, or Firm*—Renner, Otto, Boisselle & Sklar, LLP

(57) ABSTRACT

Process for reducing charge leakage in a SONOS flash memory device, including in one embodiment, forming a bottom oxide layer of an ONO structure on the semiconductor substrate to form an oxide/silicon interface having a first oxygen content adjacent the oxide/silicon interface; treating the bottom oxide layer to increase the first oxygen content to a second oxygen content adjacent the oxide/silicon interface; and depositing a nitride charge-storage layer on the bottom oxide layer. In another embodiment, process for reducing charge leakage in a SONOS flash memory device, including forming a bottom oxide layer of an ONO structure on a surface of the semiconductor substrate having an oxide/silicon interface with a super-stoichiometric oxygen content adjacent the oxide/silicon interface; and depositing a nitride charge-storage layer on the bottom oxide layer.

21 Claims, 4 Drawing Sheets

U.S. PATENT DOCUMENTS

| | | |
|---|---|---|
| 6,420,192 B1 | 7/2002 | Miki et al. ............... 438/3 |
| 6,436,757 B1 | 8/2002 | Kitamura ............... 438/240 |
| 6,461,982 B1 * | 10/2002 | DeBoer et al. ............ 438/778 |
| 2001/0038881 A1 | 11/2001 | Welsch et al. ............ 427/79 |
| 2002/0084480 A1 | 7/2002 | Basceri et al. ............ 257/306 |
| 2002/0086476 A1 | 7/2002 | Kim et al. ............ 438/200 |
| 2003/0124873 A1 * | 7/2003 | Xing et al. ............ 438/770 |

OTHER PUBLICATIONS

Copending U.S. Appl. No. 10/308,518, filed Dec. 3, 2002.

* cited by examiner

ONO FABRICATION PROCESS FOR INCREASING OXYGEN CONTENT AT BOTTOM OXIDE-SUBSTRATE INTERFACE IN FLASH MEMORY DEVICES

TECHNICAL FIELD

The present invention relates to a process for preparation of a semiconductor device including forming an ONO structure. The bottom oxide-substrate interface is provided with increased oxygen content.

BACKGROUND ART

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, flash EEPROM devices enable the erasing of all memory cells in the device using a single electrical current pulse.

Product development efforts in EEPROM device technology have focused on increasing the programming speed, lowering programming and reading voltages, increasing data retention time, reducing cell erasure times and reducing cell dimensions. One important dielectric material for the fabrication of the EEPROM is an oxide-nitride-oxide (ONO) structure. One EEPROM device that utilizes the ONO structure is a silicon-oxide-nitride-oxide-silicon (SONOS) type cell. A second EEPROM device that utilizes the ONO structure is a floating gate FLASH memory device, in which the ONO structure is formed over the floating gate, typically a polysilicon floating gate.

In SONOS devices, during programming, electrical charge is transferred from the substrate to the silicon nitride layer in the ONO structure. Voltages are applied to the gate and drain creating vertical and lateral electric fields, which accelerate the electrons along the length of the channel. As the electrons move along the channel, some of them gain sufficient energy to jump over the potential barrier of the bottom silicon dioxide layer and become trapped in the silicon nitride layer. Electrons are trapped near the drain region because the electric fields are the strongest near the drain. Reversing the potentials applied to the source and drain will cause electrons to travel along the channel in the opposite direction and be injected into the silicon nitride layer near the source region. Because silicon nitride is not electrically conductive, the charge introduced into the silicon nitride layer tends to remain localized. Accordingly, depending upon the application of voltage potentials, electrical charge can be stored in discrete regions within a single continuous silicon nitride layer.

Non-volatile memory designers have taken advantage of the localized nature of electron storage within a silicon nitride layer and have designed memory circuits that utilize two regions of stored charge within an ONO layer, in addition to storing charge in a single region of the charge storage layer. This type of non-volatile memory device is known as a two-bit EEPROM, which is available under the trademark MIRRORBIT™ from Advanced Micro Devices, Inc., Sunnyvale, Calif. The MIRRORBIT™ two-bit EEPROM is capable of storing twice as much information as a conventional EEPROM in a memory array of equal size. A left and right bit is stored in physically different areas of the silicon nitride layer, near left and right regions of each memory cell. Programming methods are then used that enable two bits to be programmed and read simultaneously. The two-bits of the memory cell can be individually erased by applying suitable erase voltages to the gate and to either the source or drain regions. In recent developments, multi-bit memory cells have been developed, in which more than two bits can be stored in separate regions of a single memory cell.

The control gate electrode is separated from the charge storage electrode by a top dielectric layer, and the charge storage electrode is separated from the semiconductor substrate (channel region) by a bottom dielectric layer, forming the oxide-nitride-oxide stack, i.e., the ONO structure or layer. As device dimensions continue to be reduced, the electrical thickness of the top and bottom dielectric layers must be reduced accordingly. Previously, this has been accomplished by scaling down the thickness of the ONO layer. However, as the ONO layer is made physically thinner, leakage currents through the ONO layer may increase, which limits the scaling down of the total physical thickness of the ONO layer. Thus, it becomes more and more important to provide high quality oxide layers, and particularly a high quality bottom oxide layer, free of defects such as oxygen vacancies, E' centers and dangling bonds.

Some of the improvements in devices can be addressed through development of materials and processes for fabricating the ONO layer. Recently, development efforts have focused on novel processes for fabrication of the ONO layer. While the recent advances in EEPROM technology have enabled memory designers to double the memory capacity of EEPROM arrays using two-bit data storage, numerous challenges exist in the fabrication of material layers within these devices. In particular, the bottom oxide layer of the ONO structure must be carefully fabricated to avoid the creation of interface states that could provide charge leakage paths from the nitride charge storage layer into the substrate. Accordingly, advances in ONO fabrication technology are needed to insure proper charge isolation in ONO structures used, for example, in MIRRORBIT™ two-bit EEPROM devices.

DISCLOSURE OF INVENTION

The present invention, in one embodiment, relates to a process for reducing charge leakage in a SONOS flash memory device, including steps of providing a semiconductor substrate; forming a bottom oxide layer of an ONO structure on the semiconductor substrate to form an oxide/silicon interface having a first oxygen content adjacent the oxide/silicon interface; treating the bottom oxide layer to increase the first oxygen content to a second oxygen content adjacent the oxide/silicon interface; and depositing a charge-storage layer on the bottom oxide layer.

In another embodiment, the present invention relates to a process for reducing charge leakage in a SONOS flash memory device, including steps of providing a semiconductor substrate; forming a bottom oxide layer of an ONO structure on a surface of the semiconductor substrate having an oxide/silicon interface with a super-stoichiometric oxygen content adjacent the oxide/silicon interface; and depositing a charge-storage layer on the bottom oxide layer.

In another embodiment, the present invention relates to a process for fabrication of a SONOS flash memory device, including steps of providing a semiconductor substrate; forming a bottom oxide layer of an ONO layer on the semiconductor substrate to form an oxide/silicon interface having a first oxygen content; treating the bottom oxide layer adjacent the oxide/silicon interface to increase the first oxygen content to a second oxygen content; and depositing a nitride charge-storage layer on the bottom oxide layer, wherein the bottom oxide layer having the second oxygen content exhibits a reduced charge leakage relative to the bottom oxide layer having the first oxygen content.

Thus, the present invention, by providing an increased oxygen content in the bottom oxide layer of the ONO structure in a flash memory device, a bottom oxide layer may be fabricated without creation of interface states resulting from oxygen vacancies, E' centers and dangling bonds, which could provide charge leakage paths from the charge-storage layer. The present invention can be carried out in a cluster tool. The present invention provides advantages such as (1) formation of a bottom oxide/substrate interface with a higher oxygen content; (2) allowing selection of any of a number of different methods for increasing the oxygen content; (3) a lower thermal budget; and (4) formation of a sharper bottom oxide/substrate interface, resulting in fewer interface states that could provide charge leakage paths. Thus, the present invention provides an advance in ONO fabrication technology, and insures proper charge isolation in ONO structures used in MIRRORBIT™ two-bit EEPROM devices, while at the same time providing distinct process and economic advantages. Although described in terms of, and particularly applicable to, MIRRORBIT™ two-bit EEPROM devices, the present invention is broadly applicable to fabrication of any semiconductor device that includes an ONO structure.

Figure 1:
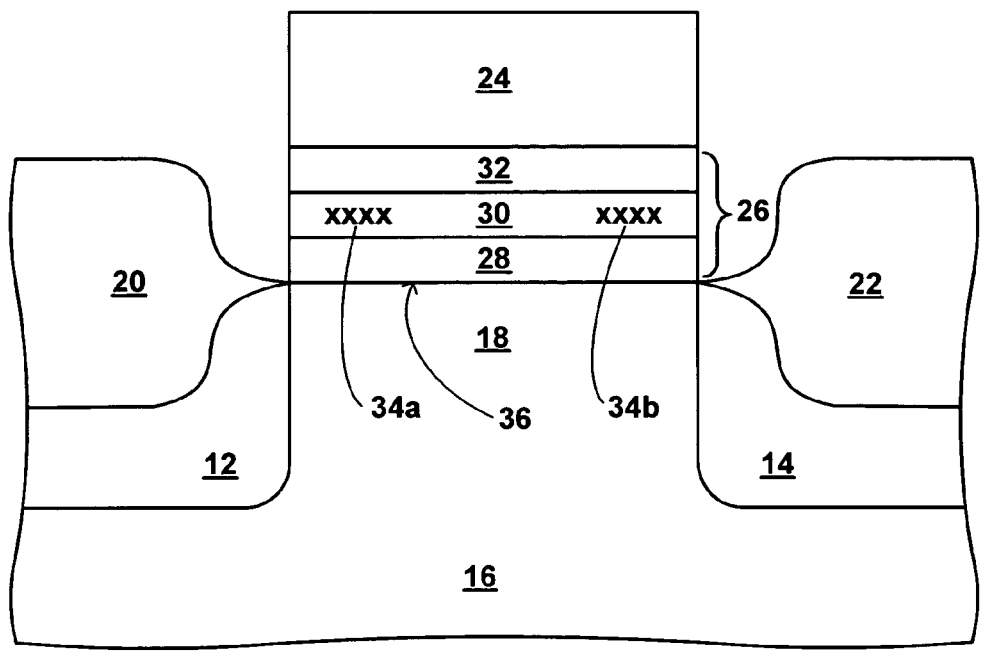
FIG. 1 schematically illustrates, in cross-section, a portion of a semiconductor substrate containing a two-bit EEPROM transistor which incorporates an ONO structure fabricated in accordance with the invention.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

Furthermore, it should be appreciated that the process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention.

MODES FOR CARRYING OUT THE INVENTION

As used herein, the term "adjacent", when used in reference to the portion of two layers "adjacent" an interface between the two layers, means the portions adjoining (or at) and nearby the interface. Thus, the portion of the layer which is "adjacent" the interface is that portion adjoining the two layers and a portion extending up to about 10%, and in one embodiment, up to about 20%, of the thickness of the layer referred to as including the portion which is adjacent.

Referring first to FIG. 1, there is schematically shown in cross-section a transistor 10 suitable for use in a two-bit EEPROM device, such as the MIRRORBIT™. The transistor 10 includes source/drain regions 12 and 14 located in a semiconductor substrate 16 and separated by a channel region 18. First and second bit line oxide regions 20 and 22 overlie source/drain regions 12 and 14, respectively. A gate electrode 24 overlies the channel region 18 and is separated therefrom by an ONO structure 26. The gate electrode 24 and the ONO structure 26 form a stacked-gate structure. The ONO structure 26 includes a bottom silicon dioxide layer 28, a silicon nitride layer 30 and a top oxide layer 32, in that order as shown in FIG. 1. As shown in FIG. 1, charges 34a and 34b may be stored in the silicon nitride layer 30, which acts as a charge or electron storage layer in the SONOS or two-bit EEPROM device. In other embodiments, either a single charge or more than two charges may be stored in the nitride charge storage layer 30.

The following description of the process of the present invention is described in the context of an ONO structure suitable for use in a two-bit EEPROM device, such as the MIRRORBIT™ device. It is to be understood that, while the present invention is discussed herein in that context, that this is merely exemplary and is not intended to limit the scope of the present invention. The ONO structure fabricated by the presently disclosed method is applicable to any semiconductor device in which an ONO structure may be included, and may be applicable to a floating gate FLASH device in which an ONO structure forms an interpoly dielectric.

In the operation of the exemplary two-bit EEPROM transistor 10, voltages are applied to the gate electrode 24 and as appropriate to the source/drain regions 12 and 14. The applied voltages cause electrical charge from the source/drain regions 12 and 14 to propagate across the channel region 18. During programming, once the charge encounters a sufficiently strong vertical field, the charge either is injected or tunnels from the channel region 18 through the bottom oxide layer 28 into the silicon nitride charge storage layer 30. The charge storage layer may also be referred to as an electron storage layer, or ESL. For example, depending upon the particular voltage levels applied to the control-gate electrode 24 and to the source/drain regions 12 and 14, the electrical charges 34a, 34b are transferred into the silicon nitride layer 30 and are localized to regions in proximity to either the source/drain region 12, or the source/drain region 14.

Those skilled in the art will recognize that for proper functioning of a two-bit EEPROM device, the electrical charges 34a, 34b should remain isolated in the regions of the silicon nitride layer 30 to which each charge is initially introduced. The proper maintenance of the electrical charges 34a, 34b in localized regions of the silicon nitride layer 30 is needed for the proper performance of a two-bit EEPROM device. Similarly, in a multibit EEPROM device, proper maintenance of the electrical charges in localized regions of the charge storage layer 30 is needed. In particular, the quality of the ONO structure 26 should be such that charge leakage paths are minimized at the interface 36 between the bottom oxide layer 28, and the channel region 18 in the substrate 16.

In accordance with the invention, charge leakage from the ONO structure 26 to the substrate 16 is minimized by forming a high quality interface 36 between the bottom oxide layer 28 and the underlying substrate or channel region 18. The reduced charge leakage and improved two-bit EEPROM performance obtained by the present invention can be better understood following a description of an ONO fabrication process carried out in accordance with the invention. In the present invention, the bottom oxide layer 28 adjacent the interface 36 between the bottom oxide layer 28 and the underlying substrate or channel region 18 is provided with an increased quantity or concentration of oxygen relative to that which would normally be present in a conventional bottom oxide layer, by which, inter alia, a high quality bottom oxide layer is obtained, and charge leakage from the charge storage layer 30 to the substrate 16 or channel region 18 in the flash memory device is reduced.

Figure 5:
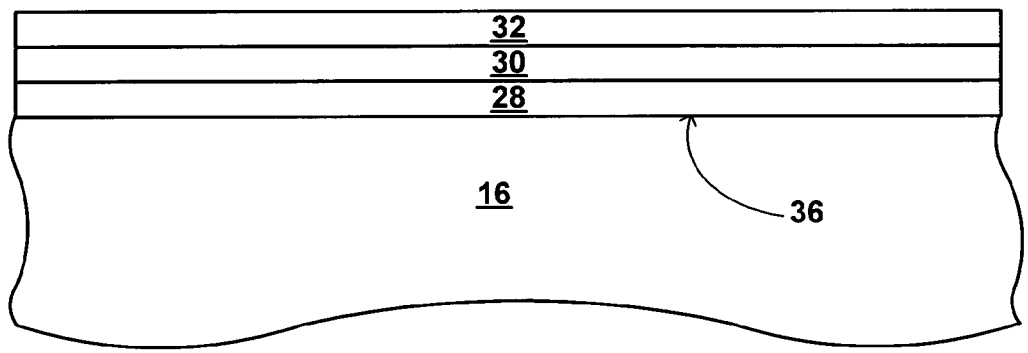
Figure 6:
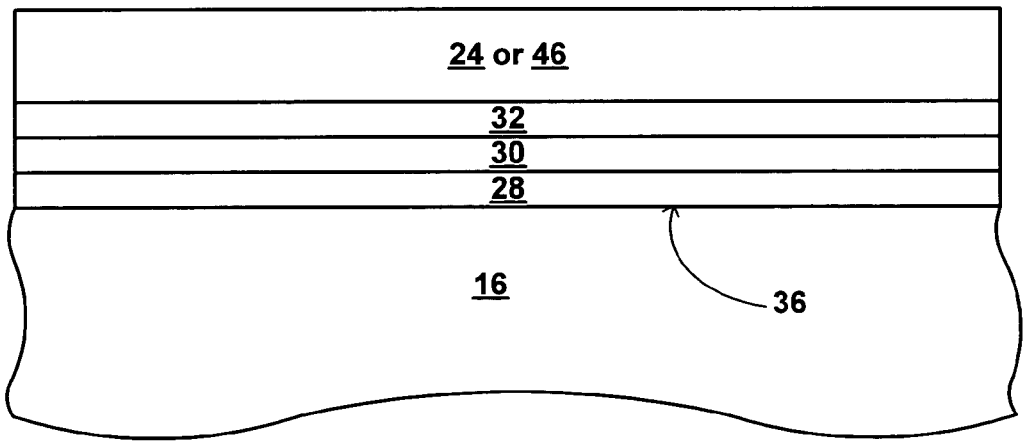
Figure 7:
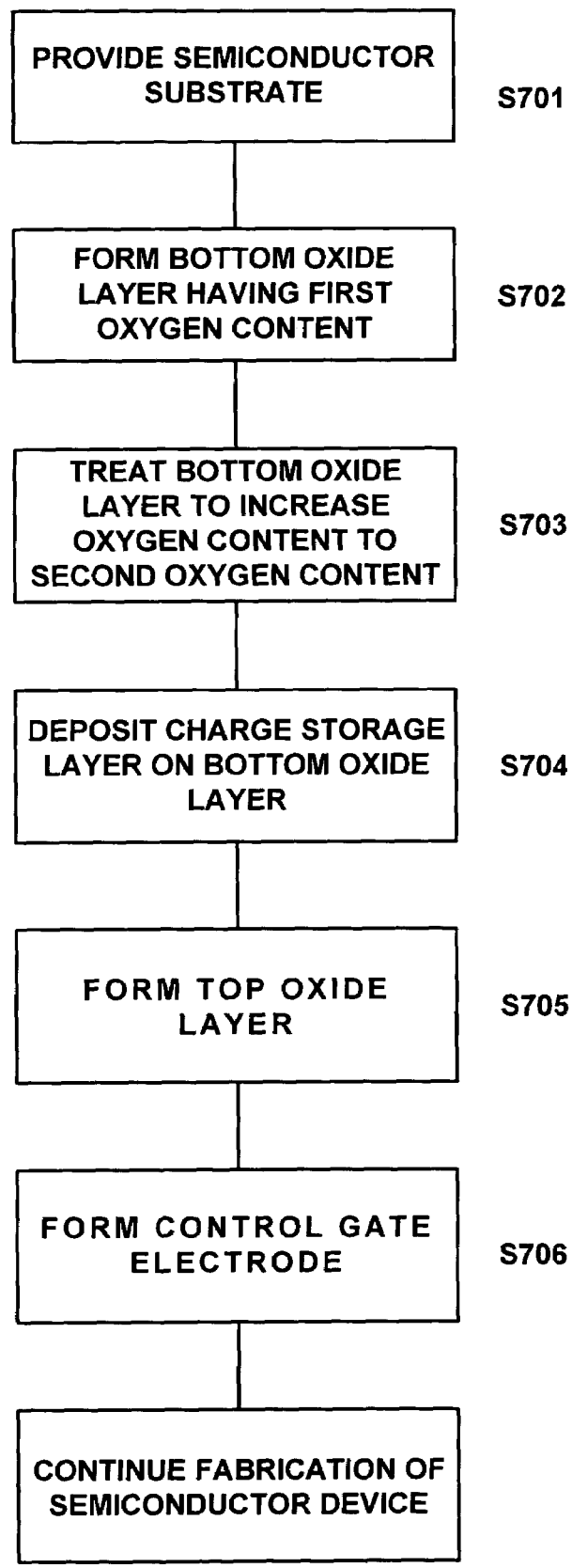
FIG. 7 is a schematic flow diagram showing the steps of one embodiment of the present invention.
Figure 8:
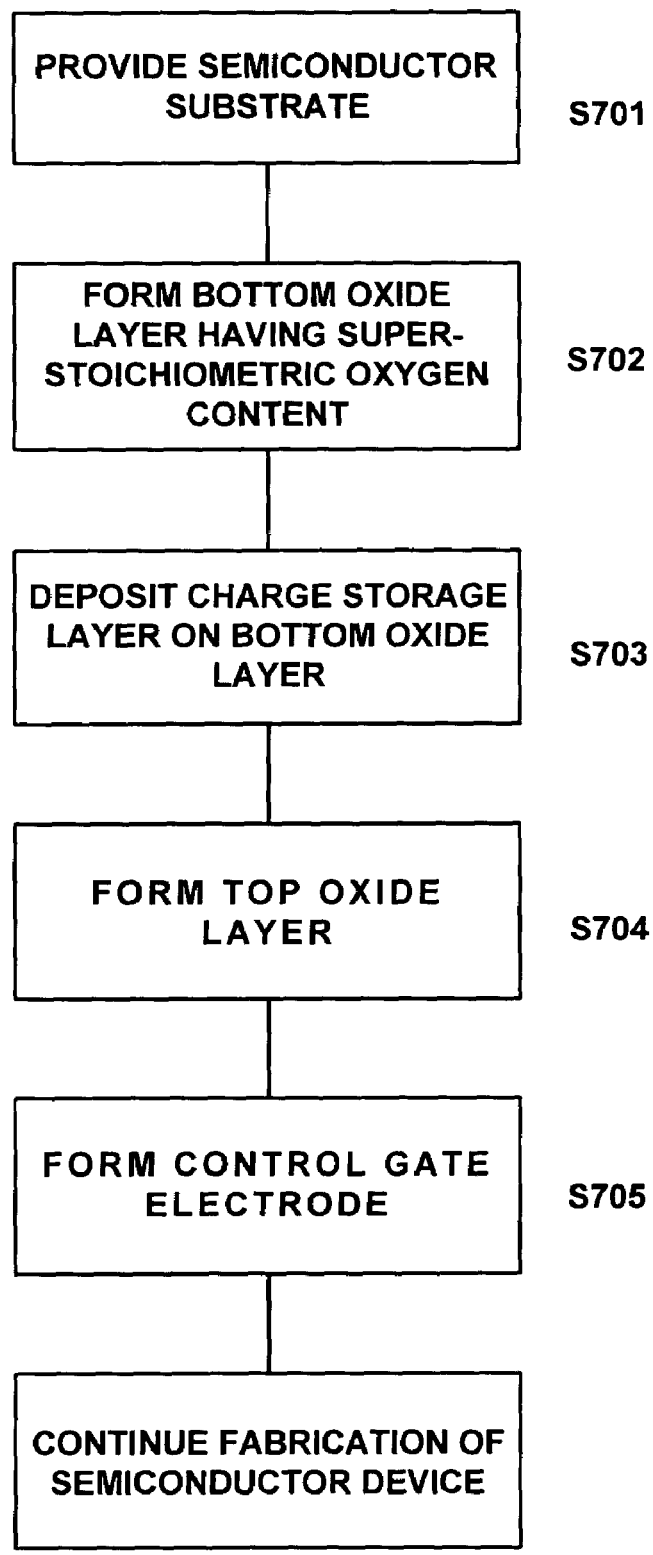
FIG. 8 is a schematic flow diagram showing the steps of another embodiment of the present invention.

The following description of the present invention follows with reference to FIGS. 2–8. FIGS. 2–6 illustrate, in cross-section, process steps for the fabrication of an ONO structure and a gate structure thereover, in accordance with the invention. FIGS. 7 and 8 are schematic flow diagrams showing the steps of two embodiments of processes in accordance with the present invention.

The present invention broadly includes two embodiments. In a first embodiment of the present invention, shown schematically in FIG. 7, a bottom oxide layer 28 is formed by a conventional process to include a first oxygen content, and is thereafter treated to increase the oxygen content from the first oxygen content to a second oxygen content. In one embodiment, the bottom oxide layer having the second oxygen content exhibits a reduced charge leakage relative to the bottom oxide layer having the first oxygen content.

In a second embodiment of the present invention, shown schematically in FIG. 8, a bottom oxide layer 28 is formed by novel methods which provide the bottom oxide layer 28 with a super-stoichiometric oxygen content. In one embodiment, the super-stoichiometric oxygen content provides an increased oxygen content relative to the oxygen content in a conventional bottom oxide. In one embodiment, the bottom oxide layer having the super-stoichiometric oxygen content exhibits a reduced charge leakage relative to a conventional bottom oxide layer.

The first step of both embodiments is the same. In the first step of the present invention, shown schematically in FIG. 7 as Step 701 and in FIG. 8 as Step 801, a semiconductor substrate is provided. The semiconductor substrate may be any appropriately selected semiconductor substrate known in the art. In one embodiment, the semiconductor substrate is a bulk silicon substrate. In one embodiment, the semiconductor substrate is a silicon-on-insulator semiconductor substrate. In another embodiment, the semiconductor substrate is a p-doped silicon substrate. Suitable semiconductor substrates include, for example, bulk silicon semiconductor substrates, silicon-on-insulator (SOI) or germanium-on-insulator (GOI) semiconductor substrates, silicon-on-sapphire (SOS) semiconductor substrates, and semiconductor substrates formed of other materials known in the art. The present invention is not limited to any particular type of semiconductor substrate.

As disclosed above, the following steps in forming the bottom oxide layer 28 differ between the two embodiments, and each embodiment is described in turn.

The bottom oxide layer 28 may comprise any material known for use as a bottom dielectric. In one embodiment, the bottom oxide layer 28 comprises silicon dioxide. In another embodiment, the bottom oxide layer 28 comprises a high-K dielectric material. In another embodiment, the bottom oxide layer 28 comprises a composite dielectric material.

As used herein, the term "high-K dielectric material" refers to a dielectric material having a K of about 10 or more. Such high-K dielectric materials include, for example, $HfO_2$, $ZrO_2$ and others, some of which are identified more fully below. In general, the term "high-K dielectric material" encompasses binary, ternary and higher oxides and any ferroelectric material having a K of about 20 or more. In addition, the high-K dielectric materials include, for example, composite materials such as hafnium silicate, which has a K of about 14, and hafnium silicon oxynitride, which has a K of about 16, depending on the relative content of oxygen and nitrogen, and hafnium silicon nitride, which has a K of about 18.

As used herein, the term "composite dielectric material" refers to a dielectric material comprising the elements of at least two other dielectric materials. A composite dielectric material generally has a K value representative of the quantities and 8K values of the components of which the composite dielectric material is comprised. A composite dielectric material may be, for example, a mixed-metal oxide, a metal silicate, a metal aluminate or a metal mixed-aluminate/silicate. Thus, for example, using hafnium as the exemplary metal, the composite dielectric material may be hafnium-zirconium oxide ($Hf_xZr_{1-x}O_2$, where x ranges between 0 and 1), hafnium silicate ($HfSiO_4$), hafnium aluminate ($HfAl_2O_5$) or a hafnium mixed-aluminate/silicate, $HfO_2/SiO_2/Al_2O_3$, which may have a formula such as $Hf_2Si_2Al_2O_{11}$. A composite dielectric material may be formed by co-deposition of its component elements, or by sequential deposition followed by a treatment step, e.g., thermal treatment, to combine the elements to form the composite dielectric material. Suitable metals for the mixed-metal oxide, metal silicate, metal aluminate or metal mixed-aluminate/silicate include, for example, hafnium, zirconium, yttrium, cerium, tantalum, titanium, lanthanum, tungsten, bismuth, barium, strontium, scandium, niobium or lead, or mixtures thereof. Other metal oxides which may be combined with one or more other metal oxides, silicon dioxide or aluminum oxide, or mixtures thereof, may be suitable. In one embodiment, the mixed-metal oxide, metal silicate, metal aluminate or metal mixed-aluminate/silicate is one which substantially does not react with silicon (or polysilicon or polysilicon-germanium) at temperatures of about 600° C. to about 800° C.

In one embodiment, the high-K or composite dielectric material includes at least one of hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$). In addition to the foregoing high-K dielectrics, other high-K dielectric materials, for example, ferroelectric high-K dielectric materials such as lead lanthanum titanate, strontium bismuth tantalate, bismuth titanate and barium zirconium titanate may be suitably used in the present invention. Other high-K or composite dielectric materials known in the art, including, for example binary and ternary oxides having K values of about 10 or higher, also may be used in the bottom oxide layer 28.

Although the following process steps are described in terms of silicon dioxide as the bottom oxide layer 28, it is to be understood that any of the foregoing materials may be used, and similar methods may be applied in forming a bottom oxide layer 28 having an increased oxygen content adjacent the interface 36 between the bottom oxide layer 28 and the underlying substrate 16 or channel region 18.

Formation of Bottom Oxide Layer and Treatment to Increase Oxygen Content

Figure 2:
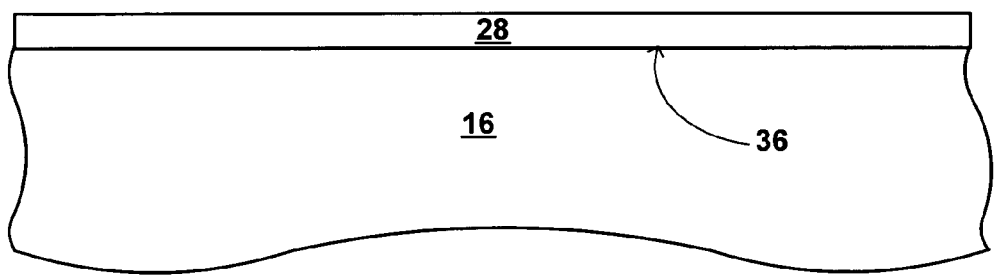
FIGS. 2–6 illustrate, in cross-section, process steps for the fabrication of an ONO structure and a gate structure thereover in accordance with the invention.

Referring to FIG. 2, in the second step of the present invention, shown schematically in FIG. 7 as Step 702, a bottom oxide layer 28 having a first oxygen content is formed on a surface of the semiconductor substrate 16. In one embodiment, the surface is the upper surface of a single crystal silicon substrate. In one embodiment, the surface previously has been processed to remove contaminants and native oxide. A suitable pre-clean procedure includes cleaning the surface with a dilute solution of hydrofluoric acid or any standard cleaning procedure used in the semiconductor industry.

In one embodiment, the bottom oxide layer 28 is formed by oxidation of the surface of the semiconductor substrate 16. The oxidation may be carried out by any appropriate oxidation process known in the art for forming a silicon dioxide bottom oxide by oxidation of a silicon surface. The oxidation may be carried out, for example, in a rapid thermal process (RTP) apparatus. The RTP apparatus may be any such apparatus known in the art. In one embodiment, the RTP apparatus is part of a single-wafer cluster tool.

In one embodiment, the oxidation of the silicon surface is carried out by placing a wafer in the RTP apparatus and flowing an oxygen-containing gas, together with other appropriate gases, into the chamber at suitable flow rates and pressure. The temperature of the RTP can be in the range from about 800° C. to about 1100° C. The flow rates and temperature may be suitably selected to provide rapid oxidation of the silicon surface, to form an oxide layer of desired thickness. In one embodiment, the oxygen-containing gas is oxygen gas, $O_2$. In another embodiment, the oxygen-containing gas is nitrous oxide, $N_2O$. The oxidation of the silicon surface continues for a period sufficient to provide a desired thickness of the bottom oxide layer 28. In one embodiment, the oxidation continues for a period in the range from about 5 seconds to about 500 seconds. In one embodiment, the oxidation continues for a period from about 30 to about 120 seconds.

Here and throughout the specification and claims, the limits of the disclosed ranges and ratios may be combined. Thus, for example, it is intended that the foregoing disclosed time ranges also include ranges from about 5 seconds to about 120 seconds and from about 30 seconds to about 500 seconds, although these ranges are not explicitly set forth.

In one embodiment, the bottom oxide layer 28 may be formed by thermally oxidizing the silicon surface of the substrate 16 at an elevated temperature in the presence of dry molecular oxygen. In one embodiment, the thermal oxidation is carried out at a temperature in the range of about 600° C. to about 900° C. The thermal oxidation process may be carried out in either a batch-type thermal oxidation furnace, or alternatively, in a single-wafer oxidation apparatus. In one embodiment, the thermal oxidation is carried out in the same RTP apparatus as that in which the other steps of the present process are carried out. In one embodiment, the RTP apparatus is part of a single-wafer cluster tool.

In one embodiment, the step of forming the bottom oxide layer is carried out by rapid thermal oxidation (RTO) at a temperature of about 1100° C. in an oxidizing atmosphere. In one embodiment, the bottom oxide layer 28 may be grown by an RTO of the silicon surface of the substrate 16 at an elevated temperature in the presence of dry molecular oxygen. In one embodiment, the thermal oxidation is carried out at a temperature in the range of about 1050° C. to about 1150° C., and in one embodiment, from about 1075° C. to about 1125° C. The thermal oxidation process may be carried out in either a batch-type thermal oxidation furnace, or alternatively, in a single-wafer oxidation apparatus. In one embodiment, the thermal oxidation is carried out in the same RTP apparatus as that in which the other steps of the present process are carried out. In one embodiment, the RTP apparatus is part of a single-wafer cluster tool. The oxygen content may range from about 1 to about 20 volume percent.

In one embodiment, the RTO is conducted in an atmosphere comprising oxygen and from about 4 to about 15 volume percent ozone at a temperature of at least about 850° C., up to about 1 100° C., and in one embodiment between about 900° C. to about 1000° C. In one embodiment, the oxygen stream contains from about 3 to about 8 volume percent ozone, in another embodiment, from about 4 to about 7 volume percent ozone, and in another embodiment, from about 5 to about 6 volume percent ozone. The atmosphere in the RTO chamber may also contain small amounts of one or more other materials known in the art to enhance the rate of silicon oxidation. Such materials include, for example, chlorine (e.g., HCl), water, etc. If employed, such materials are generally employed at their conventional amounts (e.g., when HCl is employed, it is generally employed up to about 2.5 volume percent HCl).

In one embodiment, in the RTO, the silicon substrate 16 is held in the chamber at the selected temperature for a period ranging from about 10 seconds to about 100 seconds. As will be understood, the time varies depending on the temperature, the gases used, the thickness of the bottom oxide layer 28 desired to be formed, and other factors known to those of skill in the art. For example, higher temperatures and higher contents of ozone and/or other oxidation enhancing agents generally require shorter times.

As a result of the RTO process, a bottom oxide layer 28 of a nascent ONO structure is formed on the surface of the semiconductor substrate to form an oxide/silicon interface 36 having the first oxygen content.

In one embodiment, the bottom oxide layer 28 is formed by a deposition process. In one embodiment, the bottom oxide layer 28 is formed by an RTCVD process. In one embodiment, the RTCVD deposition is carried out in the same RTP apparatus as that in which the other steps of the present process are carried out. In one embodiment, the RTP apparatus is part of a single-wafer cluster tool. The bottom oxide can also be formed by depositing the oxide in a batch furnace by an LPCVD process.

In one embodiment, the bottom oxide layer 28 is formed by in-situ steam generation (ISSG) oxidation of a part of the upper surface of the silicon substrate 16 or channel region 18. A process for forming a bottom oxide by ISSG oxidation of a silicon substrate is disclosed in commonly assigned, copending U.S. application Ser. No. 10/023,548, filed Dec. 17, 2001, the disclosure of which is hereby incorporated by reference for its teachings relating to ISSG oxidation.

In one embodiment, the oxidation forms the bottom oxide layer 28 having a thickness of about 20 to about 150 angstroms (Å), and in another embodiment, the silicon oxide layer 28 has a thickness of about 100 Å.

As a result of the foregoing step, by an appropriate method, the bottom oxide layer 28 is formed having a first oxygen content. In one embodiment, the oxygen content of the bottom oxide layer 28 is substantially stoichiometric, that is, the oxide has substantially the formula $SiO_2$, except that it includes a number of oxygen vacancies. The oxygen content is that which is normally obtained by a conventional oxide formation or deposition, such as described in the foregoing. In one embodiment, the bottom oxide layer 28 so formed includes a number of oxygen vacancies. In one embodiment, the oxygen content of the bottom oxide layer 28 is slightly sub-stoichiometric, i.e., it is slightly depleted in oxygen content relative to the theoretical formula $SiO_2$. Thus, in one embodiment, the oxide may have a chemical formula which could be expressed as $SiO_x$, wherein $x \leq 2$, and in another embodiment, $SiO_x$, wherein x is in the range from about 1.9 to about 1.99, and in another embodiment, x=2. Thus, the first oxygen content may be expressed as equal to or less than a stoichiometric oxygen content for $SiO_2$. Such a sub-stoichiometric embodiment would include a number of oxygen vacancies.

Although an exactly stoichiometric oxygen content might be expected to include no oxygen vacancies, the stoichiometric content generally relates to the average oxygen content. As will be recognized, while an average oxygen content may be stoichiometric, oxygen vacancies may still be present adjacent the interface 36 if the layer contains a non-uniform oxygen content. As noted, the present invention is primarily concerned with oxygen vacancies adjacent the interface 36 between the bottom oxide layer and the underlying substrate.

In the next step of this embodiment, shown schematically in FIG. 7 as Step 703, the bottom oxide layer 28 having a first oxygen content is treated to increase the oxygen content from the first oxygen content to a second, greater oxygen content. The increase in oxygen content may be accomplished by any of several different methods, briefly summarized in the following. Each of three methods are briefly described in the following: oxygen implantation, ozone annealing and a combination of (a) a decoupled plasma oxidation, and (b) annealing in an atmosphere comprising oxygen and at least one inert gas, such as Ar or $N_2$.

Figure 3:
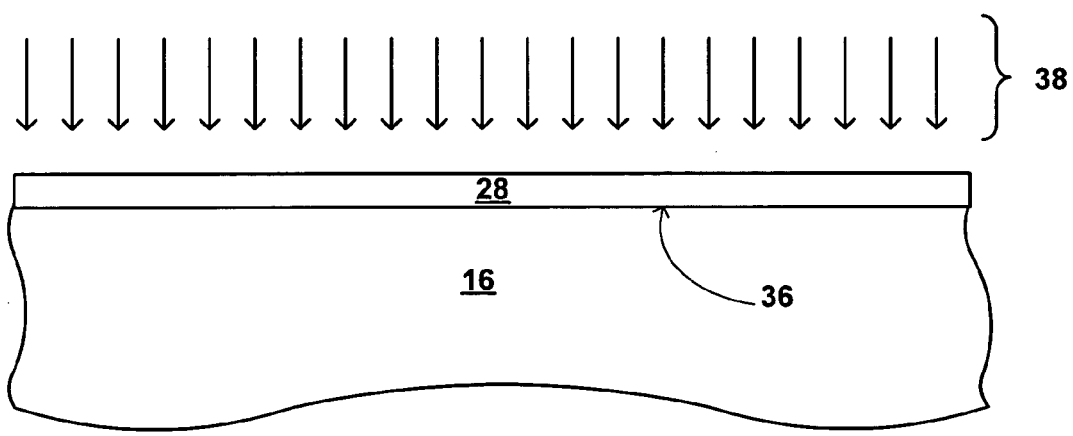

FIG. 3 schematically illustrates treating the bottom oxide layer adjacent the oxide/silicon interface 36 to increase the first oxygen content to a second oxygen content, by addition of oxygen, indicated schematically by arrows 38. The arrows 38 represent oxygen atoms or ions being added to the bottom oxide layer 28 by an appropriate method, such as one of the methods described in the following.

In one embodiment, the step of treating the bottom oxide layer comprises an oxygen implantation. In one embodiment, the oxygen implantation is by at least one of an ion implantation or a plasma implantation. In one embodiment, the oxygen implantation is by an ion implantation. In one embodiment, the oxygen implantation is by a plasma implantation.

In the ion implantation, ions of oxygen are implanted by a suitable ion implantation device so that the oxygen is implanted in the bottom oxide layer 28, and in one embodiment, the oxygen is implanted preferentially near the interface 36 between the bottom oxide layer 28 and the underlying silicon substrate 16. In one embodiment, the implantation is followed by an annealing step.

As is known in the art, advantages of implantation include the ability to exactly control the quantity of implanted ions, in this case oxygen ions, and the ability to select and control the depth of implantation. Both of these advantages can be exploited in the present invention, since it is desired to add a relatively limited quantity of oxygen at a selected location in the bottom oxide layer 28, so as to increase the oxygen content of the bottom oxide layer 28 from the first to the second oxygen content. More specifically, the oxygen is implanted in a region of the bottom oxide layer 28 adjacent its interface 36 with the underlying substrate 16 or channel region 18.

In the plasma implantation, the oxygen ions are implanted more generally throughout the thickness of the bottom oxide layer 28. Following the implantation, the annealing step drives the implanted oxygen towards the interface 36 between the bottom oxide layer 28 and the underlying substrate 16, thus increasing the oxygen content from the first to the second oxygen content. As is known, the plasma implantation operates at somewhat lower energies than ion implantation, so is more useful for relatively thin oxide layers. In one embodiment, the implant energy may generally range from about 5 keV to about 25 keV. In another embodiment, the implant energy is from about 2 KeV to about 10 KeV.

In one embodiment, the plasma implantation uses Plasma Doping (PLAD) systems for implanting oxygen into the bottom oxide layer 28. In a PLAD system, a semiconductor wafer is placed on a conductive platen located in a chamber, and the platen functions as a cathode. An ionizable gas, in this case oxygen, is introduced into the chamber, and a high voltage pulse is applied between the platen and an anode (or the chamber walls), causing the formation of a plasma having a plasma sheath in the vicinity of the wafer. The applied voltage causes ions in the plasma to cross the plasma sheath and to be implanted into the wafer. The depth of implantation is related to the voltage applied between the wafer and the anode.

In another embodiment, other types of plasma implantation systems, such as Plasma-Source Ion Implantation, or Plasma-Immersion Ion implantation, may be used. In these plasma systems, a separate plasma source is used to provide a continuous plasma. In such systems, the platen and the wafer are immersed in a continuous plasma and at intervals, a high voltage pulse is applied between the platen and the anode, causing ions in the plasma to be accelerated toward the wafer.

In another embodiment, a pulsed plasma system may be used. A pulsed plasma doping system separates the plasma ignition function from the ion implantation function. An ignition voltage pulse is supplied to an ionizable gas (in this case oxygen) and an implantation voltage pulse is applied to the target. The implantation voltage pulse can be generated from the ignition voltage pulse or can be generated separately from the ignition voltage pulse. In this embodiment, oxygen ions may be implanted in the target at lower energy levels, thus providing enhanced control to the treatment process.

In one embodiment, the step of treating the bottom oxide layer comprises annealing in an atmosphere comprising one or more of ozone or nitrous oxide or other highly reactive oxygen-containing materials. In one embodiment, the annealing is in an atmosphere comprising nitrous oxide, and is carried out at a temperature in the range from about 600° C. to about 1100° C. In another embodiment, the annealing is in an atmosphere comprising ozone, and is carried out at a temperature in the range from about 400° C. to about 600° C.

In one embodiment, the annealing is carried out in a high density plasma comprising one or more of ozone or nitrous oxide. In one embodiment, the high density plasma annealing treatment is at a temperature in the range from about 400° C. to about 500° C. In one embodiment, the plasma power is between about 1000 to about 5000 watts. In one embodiment, the chamber pressure is between about 5 and about 100 torr. The plasma anneal may be carried out for a time between about 0.5 and about 5 minutes. The flow rate of nitrous oxide and/or ozone may be appropriately selected.

The annealing in one or more of ozone or nitrous oxide causes oxygen to enter the bottom oxide layer 28, and forces the oxygen through the layer toward the interface 36 between the bottom oxide layer 28 and the underlying substrate 16, thus increasing the oxygen content from the first to the second oxygen content.

In one embodiment, the step of treating the bottom oxide layer comprises (a) a decoupled plasma oxidation, and (b) annealing in an atmosphere comprising oxygen and at least one inert gas, such as Ar or $N_2$. Other inert gases may be used, such as He, Ne or Kr. In one embodiment, (a) and (b) are sequentially repeated from two to about five times. In this embodiment, the steps both result in additional oxygen entering the bottom oxide layer 28, and in distributing the oxygen through the bottom oxide layer 28 toward the interface 36 between the bottom oxide layer 28 and the underlying substrate 16 or channel region 18. These steps fill any vacancies and also cause the oxygen to react with any hydrogen present, after which water thus formed is forced to exit the layer.

The decoupled plasma in (a) differs from a conventional plasma in that in a decoupled plasma, the applied power is separated into a source power, which is a high power supplied to the chamber wall, and a bias power which is connected to the wafer. The source power ionizes the gas supplied into the chamber, and generates the reactive species in the chamber. The bias power on the wafer drives the reactive species towards the substrate and thus controls the rate of reaction. Hence, separation of these power sources provides better control of the process, as compared to conventional plasma which uses a single power source to create the plasma and to drive the generated species to the target.

In one embodiment, the present embodiment of the invention uses a decoupled plasma source (DPS) poly chamber from Applied Materials, Inc., Santa Clara, Calif., for example an Applied Materials AMAT DPS Poly chamber.

Those skilled in the art will realize that power settings, residence times, gas flow rates are equipment-specific and will vary from one brand of plasma equipment to another. In general, the gas mixture employed includes oxygen in some form, and may also include argon. The oxygen flow ranges from about 10 standard cubic centimeters per minute (sccm) to about 500 sccm, and in one embodiment, about 250 sccm. In an embodiment including argon, the argon flow may range from about 20 sccm to about 300 sccm, and in one embodiment, about 50 sccm. In one embodiment, the gas pressure in the chamber ranges from about 5 millitorr (mT) to about 100 mT, and in one embodiment, about 20 mT. The decoupled plasma equipment parameters include a source power of about 400 W to about 2000 W, and in one embodiment, about 1400 W, and a bias power of about 50 W to about 500 W, and in one embodiment, about 200 W. The decoupled plasma may be applied to the bottom oxide layer 28 for a period from about 5 seconds to about 100 seconds, and in one embodiment, for about 30 seconds.

Following application of (a) the decoupled plasma, the bottom oxide layer 28 is (b) annealed in an atmosphere comprising oxygen and at least one inert gas, such as Ar or $N_2$, at a temperature in the range from about 600° C. to about 1100° C., and in one embodiment from about 800° C. to about 950° C., for a period ranging from about 5 seconds to about 5 minutes, and in one embodiment, for a period ranging from about 15 seconds to about 60 seconds. In one embodiment, the ratio of oxygen to the at least one inert gas ranges from about 1:20 to about 1:1, and in another embodiment, the ratio ranges from about 1:10 to about 1:2, and in another, the ratio ranges from about 1:7 to about 1:5. The annealing step (b) drives the oxygen into the bottom oxide layer 28, towards the interface 36 between the bottom oxide layer 28 and the underlying substrate 16.

The foregoing methods of treating the bottom oxide layer adjacent the oxide/silicon interface 36 to increase the first oxygen content to a second oxygen content are intended to be exemplary and non-limiting. A person of skill in the art may recognize or be aware of additional methods for carrying out this treatment.

Formation of Bottom Oxide Layer Having Super-Stoichiometric Oxygen Content.

In one embodiment, the bottom oxide layer 28 is formed by methods which provide a super-stoichiometric oxygen content in the initially formed bottom oxide layer 28. Thus, in such embodiments, it is not necessary to add or carry out a subsequent treatment step in order to increase the oxygen content, since the oxygen content is already increased to a super-stoichiometric level. Due to the highly oxidizing conditions employed in these embodiments, a super-stoichiometric oxygen content may be obtained in the bottom oxide layer 28. Thus, in one embodiment, the oxide may have a chemical formula which may be expressed as $SiO_x$, wherein x>2, and in another embodiment, $SiO_x$, wherein x is in the range from about 2.01 to about 2.1. Thus, the oxygen content may be described as greater than the stoichiometric oxygen content for $SiO_2$. Such a super-stoichiometric embodiment would include very few if any oxygen vacancies. In one embodiment, the bottom oxide layer 28 as formed by the methods of the present embodiment contains substantially no oxygen vacancies.

Thus, in this embodiment, the process for reducing charge leakage in a SONOS flash memory device, includes the steps of providing a semiconductor substrate; forming a bottom oxide layer of an ONO structure on a surface of the semiconductor substrate to form an oxide/silicon interface 36 having a super-stoichiometric oxygen content; and depositing a nitride charge-storage layer on the bottom oxide layer. The step of forming the bottom oxide layer 28 having an oxide/silicon interface 36 having a super-stoichiometric oxygen content is described in more detail in the following. In one embodiment, the bottom oxide layer having the oxide/silicon interface 36 having a super-stoichiometric oxygen content exhibits a reduced charge leakage relative to a bottom oxide layer having a stoichiometric or sub-stoichiometric oxygen content.

In one embodiment, the step of forming the bottom oxide layer is carried out by decoupled plasma oxidation in an oxidizing atmosphere. Thus, in this embodiment, a decoupled plasma similar to that described above may be employed, with the oxidizing gas flow and concentration, the source and bias power and the reaction times generally in the higher end of the ranges given above with respect to the "oxygen content increasing" embodiment. In addition to oxygen, or instead of oxygen, the plasma atmosphere used in this embodiment may also include another oxidizing gas such as ozone and/or nitrous oxide. Thus, in one embodiment, in the decoupled plasma, the oxygen flow ranges from about 100 sccm to about 1000 sccm, and in one embodiment, about 500 sccm. In an embodiment including argon, the argon flow may range from about 20 sccm to about 300 sccm, and in one embodiment, about 50 sccm. In an embodiment including ozone and/or nitrous oxide in addition to or instead of oxygen, the flow(s) of these gases may range from about 10 sccm to about 1000 sccm each, and in one embodiment about 250 sccm each. In one embodiment, when these gases are combined with oxygen, the flows of oxygen and the ozone and/or nitrous oxide may be adjusted to provide a combined oxidizing gas flow in the range from about 100 sccm to about 1000 sccm. In one embodiment, the gas pressure in the chamber ranges from about 10 mT to about 200 mT, and in one embodiment, about 50 mT. The decoupled plasma equipment parameters include a source power of about 500 W to about 2500 W, and in one embodiment, about 1800 W, and a bias power of about 100 W to about 500 W, and in one embodiment, about 250 W. The decoupled plasma may be applied to form the bottom oxide layer 28 for a period from about 10 seconds to about 150 seconds, and in one embodiment, for about 60 seconds. Persons of skill in the art can select appropriate conditions for the decoupled plasma oxidation to form the bottom oxide layer 28 having a super-stoichiometric oxygen content. As a result of the decoupled plasma oxidation process, a bottom oxide layer 28 of a nascent ONO structure is formed on the surface of the semiconductor substrate to form an oxide/silicon interface 36 having a super-stoichiometric oxygen content.

In one embodiment, the step of forming the bottom oxide layer is carried out by remote plasma oxidation in an oxidizing atmosphere. In one embodiment, the remote plasma treatment conditions include forming an oxygen plasma with a flow rate between about 1 to about 100 sccm, an operation temperature in the range of about 450° C. to about 800° C., an operation pressure in the range of about 0.1 to about 2 torr and a power of about 2000 to about 4000 Watts for about 15 to about 100 seconds. Persons of skill in the art can select appropriate conditions for the remote plasma oxidation to form the bottom oxide layer 28 having a super-stoichiometric oxygen content. As a result of the remote plasma oxidation process, a bottom oxide layer 28 of a nascent ONO structure is formed on the surface of the semiconductor substrate to form an oxide/silicon interface 36 having a super-stoichiometric oxygen content.

In one embodiment, the step of forming the bottom oxide layer is carried out by a thermal oxidation comprising ozone as an oxidizing agent. In one embodiment, the surface of the substrate is first pre-cleaned with a gas mixture comprising ozone. In this embodiment, any of the foregoing oxidation processes, or a simple thermal oxidation, may be carried out, using ozone as the oxidizing agent, in the absence of other oxidizing agents.

In one embodiment, the ozone oxidation process is performed in a reaction chamber, at a temperature of about 600° C. to about 1300° C., and at atmospheric pressure or less. During the ozone oxidation, ozone and oxygen are mixed in a predetermined ratio, cooled to room temperature or less, and then injected into the reaction chamber. In one embodiment, the ratio of the ozone to oxygen is between about 0.5% to 25% by volume, and in one embodiment, from about 1% to about 10% by volume. In one embodiment, the gas mixture can include steam and a gas such as a halogen or a halogen containing compound which enhances the oxidation process. In general, during the ozone oxidation, ozone ($O_3$) decomposes into diatomic oxygen ($O_2$) and highly reactive atomic oxygen (O). This leaves a large number of the highly reactive free oxygen atoms (O) available to combine with silicon to form silicon dioxide ($SiO_2$). As a result of the ozone oxidation process, a bottom oxide layer 28 of a nascent ONO structure is formed on the surface of the semiconductor substrate with an oxide/silicon interface 36 having a super-stoichiometric oxygen content, in a portion of the bottom oxide layer 28 adjacent the interface 36.

In one embodiment, the step of forming the bottom oxide layer is carried out in an oxygen rich ambient, for an extended period, but at a lower temperature. In this embodiment, the bottom oxide layer 28 is grown at a slow rate to form more nearly stoichiometric $SiO_2$ with fewer oxygen vacancies or to form an oxygen-rich $SiO_2$ having a super-stoichiometric oxygen content as a result of the presence of more reactive oxygen species and higher oxygen partial pressure and extended reaction time during $SiO_2$ growth. In this embodiment, the temperature of the oxidation is in a range from about 300° C. to about 600° C. In this embodiment, the time of the oxidation is in a range from about 10 minutes to about 8 hours. In this embodiment, the oxygen partial pressure is greater than about 21% of the total pressure of the oxidation atmosphere (where the partial pressure of oxygen in normal atmospheric air is about 21%). In another embodiment, the oxygen partial pressure is in a range from about 21% to about 100%, and in another embodiment, in a range from about 22% to about 80%, and in one form about 25% to about 50%. The increased oxygen available for oxidation may be obtained by applying higher than atmospheric pressure, by increasing the oxygen content of the atmosphere relative to other gases, or by a combination of these two methods.

In another embodiment, more-reactive oxygen species can be used under the foregoing conditions, such as ozone ($O_3$) or radical oxygen generated by other methods. The ozone or radical oxygen or both may be mixed with oxygen, as above. In one embodiment, the partial pressure of ozone ranges from about 0.1% to about 10%, and in another embodiment, the partial pressure of ozone ranges from about 1% to about 5%. Generation of ozone and radical oxygen species may be by any appropriate method known in the art.

In one embodiment, the bottom oxide layer 28 is deposited by a CVD method under oxygen at a high pressure at a temperature of about 400° C. to about 480° C. In one embodiment, the CVD is carried out at a temperature of about 430° C. In one embodiment, the CVD method is a thermal CVD, and in another embodiment, the CVD method is plasma-enhanced CVD (PECVD). Suitable starting materials may be appropriately selected.

In one embodiment, the bottom oxide layer 28 is deposited by a high pressure CVD method using tetraethylorthosilicate (TEOS) and ozone. The source gases for this CVD method are therefore TEOS and ozone, $O_3$. The temperature of the CVD in this embodiment is in a range from about 300° C. to about 600° C. The pressure of the CVD in this embodiment is in a range from about 1 torr to about 10 torr.

In one embodiment, the step of forming the bottom oxide layer 28 is carried out by a combination of alternating steps of thermal oxidation and HTO deposition. In this embodiment, the thermal oxidation may be a conventional thermal oxidation of silicon of the substrate 16, alternating with a HTO deposition to form the bottom oxide layer 28 having a super-stoichiometric oxygen content. In one embodiment, the thermal oxidation step includes thermally oxidizing the surface of the substrate 16 at an elevated temperature in the presence of dry molecular oxygen, such as described above. In one embodiment, the thermal oxidation step is carried out at a temperature of about 900° C. to about 1100° C. In one embodiment, the HTO deposition process is carried out at a temperature of about 700° C. to about 800° C. In the HTO deposition, silicon dioxide is deposited by either an RTCVD or an LPCVD process.

In the RTCVD embodiment, the bottom oxide layer 28 is deposited in an RTCVD apparatus using nitrous oxide ($N_2O$) and dichlorosilane. As noted above, in one embodiment, the RTCVD process is carried out at a temperature of about 700° C. to about 800° C. for a total processing time, in one embodiment from about 1 to about 5 minutes, and in another embodiment, about 3 minutes. In the RTCVD process, a three-step deposition sequence is used including a ramp up step, a deposition step, and a cool down step. In one embodiment, during the deposition step about 1000 to about 3000 sccm, and in one embodiment, about 2000 sccm of nitrous oxide is used. In one embodiment, about 25 to about 75 sccm, and in one embodiment, about 50 sccm, of dichlorosilane is used.

In the LPCVD embodiment, the bottom oxide layer 28 is deposited in a batch type of furnace at temperatures of about 700° C. to about 800° C. The LPCVD process, in one embodiment, is carried out at a pressure of about 200 to about 500 millitorr (mT), using either oxygen or nitrous oxide and either dichlorosilane or silane gas.

The alternating steps of thermal oxidation and HTO deposition may be carried out in either order, and may be repeated 2 or 3 times if needed to obtain a desired thickness of the bottom oxide layer 28.

In one embodiment, the step of forming the bottom oxide layer 28 is carried out by radical oxidation. As a result of the alternating thermal oxidation and HTO deposition process, a bottom oxide layer 28 of a nascent ONO structure is formed on the surface of the semiconductor substrate to form an oxide/silicon interface 36 having a super-stoichiometric oxygen content.

Following formation of the bottom oxide layer 28, in one embodiment, the layer 28 having had the first oxygen content increased to the second oxygen content, or in one embodiment, the layer 28 having been formed with a super-stoichiometric and/or increased oxygen content, in accordance with either of the foregoing embodiments, fabrication of the ONO structure, and of the flash memory device, continues.

Figure 4:
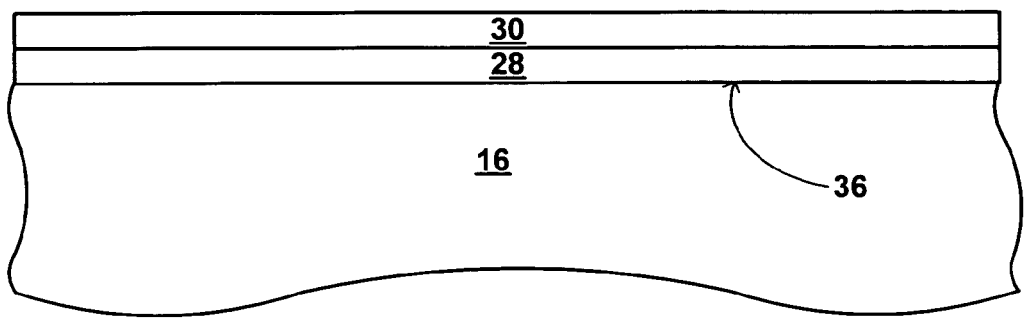

In the next step of the present invention, shown schematically in FIG. 7 as Step 704 and in FIG. 8 as Step 803, a charge storage layer 30 is formed on the bottom oxide layer 28. As shown in FIG. 4, after forming the bottom oxide layer 28, the charge storage layer 30 is deposited on the bottom oxide layer 28. In one embodiment, the charge storage layer 30 comprises silicon nitride. In another embodiment, the charge storage layer comprises a high-K dielectric material. In another embodiment, the charge storage layer 30 comprises both a high-K dielectric material and a standard-K dielectric material, such as silicon nitride. In one embodiment, the layer 30 comprises a composite dielectric material, which comprises a composite or a reaction product of two or more dielectric materials, one of which is a high-K dielectric material and the other of which may be a standard-K dielectric material such as silicon nitride or may be a second or additional high-K dielectric material. Thus, in one embodiment, the high-K dielectric material completely replaces silicon nitride in the charge storage layer 30. In another embodiment, the high-K dielectric material is, in essence, added to or combined with, silicon nitride to form a charge storage layer 30. In another embodiment, the charge storage layer 30 includes a composite dielectric material which replaces silicon nitride. Suitable high-K dielectric materials for use in a high-K charge storage layer are disclosed in copending U.S. application Ser. No. 10/036,757, filed Dec. 31, 2001, which is incorporated herein by reference for its disclosure relating to high-K dielectric materials for use in a charge storage layer of an ONO structure. Suitable methods for deposition of a high-K dielectric material layer include RTCVD carried out at a temperature of about 400° C. to about 800° C. The high-K dielectric material may be formed by reacting a suitable metal-containing gas, e.g., hafnium tetra-t-butoxide with a suitable oxygen-containing gas, e.g., oxygen ($O_2$) or nitrous oxide ($N_2O$).

In one embodiment, the high-K dielectric material may be deposited by other chemical vapor deposition (CVD) methods. The CVD method may be any appropriate CVD method known in the art for deposition of a high-K material. For example, the CVD method may be ALD (ALCVD), PECVD, MOCVD or MLD, in addition to the above-mentioned RTCVD.

In one embodiment, the high-K dielectric material includes at least one of hafnium oxide ($HfO_2$), zirconium oxide ($ZrO_2$), tantalum oxide ($Ta_2O_5$), barium titanate (Ba-$TiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), silicon titanate ($SiTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$). In addition to the foregoing high-K dielectrics, other high-K dielectric materials, for example, ferroelectric high-K dielectric materials such as lead lanthanum titanate, strontium bismuth tantalate, bismuth titanate and barium zirconium titanate may be suitably used in the present invention. Other high-K dielectric materials known in the art, including, for example binary and ternary oxides having K values of about 20 or higher, also may be used in the present invention.

With respect to embodiments in which the charge storage layer comprises materials other than a nitride, herein the combined structure 26, including the charge storage layer 30 and the two oxide layers 28, 32 between which it is sandwiched, is referred to as an ONO structure, even though the "N" layer may be other than a nitride.

In one embodiment, the charge storage layer 30 is silicon nitride formed by means of a rapid-thermal-chemical-vapor-deposition (RTCVD) process. In one embodiment, the RTCVD process is carried out at a temperature of about 700° C. to about 800° C. The silicon nitride material may be formed by reacting a suitable nitrogen-containing gas, e.g., ammonia ($NH_3$) with a suitable silicon-containing gas, e.g., dichlorosilane ($SiCl_2H_2$) or silane ($SiH_4$).

In one embodiment, the process is carried out for a period of time and at gas flow rates sufficient to form a silicon nitride layer having a thickness of about 50 to about 200 angstroms. In another embodiment, the process is carried out for a period of time and at gas flow rates sufficient to form a silicon nitride layer having a thickness of about 100 angstroms.

In one embodiment, ammonia is introduced in the RTCVD apparatus at a flow rate of about 1000 sccm and either dichlorosilane or silane is introduced at a flow rate of about 30 to about 50 sccm. The RTCVD process is carried out in three steps including an initial temperature ramp, a deposition step, and cool-down step. In one embodiment, the total reaction time is about 1 to about 3 minutes. In another embodiment, the silicon nitride deposition step is completed in about 2 minutes.

In another embodiment, the charge storage layer 30 is silicon nitride formed by means of a low-pressure-chemical-vapor-deposition (LPCVD) process. In this alternative embodiment, the silicon nitride can be formed in a batch deposition apparatus. In one embodiment, the LPCVD process is carried out at an absolute pressure of about 200 to about 500 mT, at temperatures of about 700° C. to about 800° C. using ammonia and either dichlorosilane or silane gas.

In another embodiment, the charge storage layer is aluminum oxide, $Al_2O_3$. The aluminum oxide may be deposited by any suitable method, for example by LPCVD. Suitable precursors for CVD include organo-aluminum compounds such as aluminum isopropoxide and aluminum beta-diketonate. The use of various aluminum beta-diketonates in APCVD deposition of aluminum oxide is discussed, for example, in U.S. Pat. No. 6,258,157. A liquid precursor for the CVD of aluminum oxide, triethyldialuminum tri-sec-butoxide, is disclosed in U.S. Pat. No. 6,180,190.

The charge storage layer 30 may be deposited by other suitable methods known in the art.

Following deposition of the charge storage layer 30, in the next step of the process of fabricating the flash memory device, shown schematically in FIG. 7 as Step 705, and in FIG. 8 as Step 804, a top oxide layer 32 is formed on the charge storage layer 30 by a suitable technique. In one embodiment, the top oxide layer 32 is formed by an in-situ steam generation (ISSG) oxidation of the upper surface of the charge storage layer 30. In one embodiment, the top oxide layer 32 is formed by an HTO deposition, such as the RTCVD or LPCVD methods described above. In one embodiment, the top oxide layer 32 is deposited by another suitable method, such as PECVD, ALD (ALCVD), PLD, MLD or MOCVD. The CVD method may be any appropriate CVD method known in the art.

As shown in FIG. 5, after depositing the charge storage layer 30, the top oxide layer 32 is formed on the silicon nitride layer 30. The top oxide layer 32 may be formed by any appropriate method known in the art. In one embodiment, when the charge storage material is silicon nitride, the top oxide layer 32 is grown by oxidation of a portion of the silicon nitride layer 30. In another embodiment, the top oxide layer 32 is deposited by an appropriate deposition method.

In one embodiment, the top oxide layer 32 is formed by ISSG oxidation of a part of the upper surface of the charge storage layer 30, when it is silicon nitride. A process for forming a top oxide by ISSG oxidation of a silicon nitride layer is disclosed in commonly assigned, copending U.S. application Ser. No. 10/023,548, filed Dec. 17, 2001, the disclosure of which has been incorporated by reference for its teachings relating to ISSG oxidation.

In one embodiment, in which the deposition of the silicon nitride layer 30 is carried out by RTCVD in the RTP apparatus, at the completion of the deposition, when the cool-down step has reduced the temperature to about 400° C. to about 500° C., the apparatus is converted for an ISSG oxidation process without removing the wafer from the apparatus, and without exposing the wafer to the outside atmosphere. Thus, these steps in the fabrication of the SONOS flash memory device may be carried out sequentially in a single apparatus, without removing the wafer from the apparatus between the charge storage layer 30 formation steps and the top oxide layer 32 formation steps.

As shown in FIG. 6, following formation of the ONO structure 26 in accordance with the present invention, shown schematically in FIG. 7 as Step 706, and in FIG. 8 as Step 805, a layer forming a control gate electrode 24 is formed on the top oxide layer 32. The stacked-gate structure shown in FIG. 1 is completed by depositing a layer of gate forming material overlying the top oxide layer 32. A lithographic patterning and etching process may then be carried out to define the stacked gate structure shown in FIG. 1, including the control gate electrode 24 and the ONO structure 26. Those skilled in the art will recognize that various gate-forming materials can be used to fabricate the control gate electrode 24. For example, the control gate electrode 24 can be formed with polycrystalline silicon, silicon-germanium, amorphous silicon, a refractory metal silicide, a metal, and the like.

Following formation of the control gate electrode 24 and the ONO structure 26, fabrication of the semiconductor device continues, as indicated in the final step of FIGS. 7 and 8.

There has been disclosed in accordance with the invention a process for fabricating an ONO floating-gate electrode, for example for use in a MIRRORBIT™ two-bit EEPROM device, that fully provides the advantages set forth above. As noted above, the process of the invention may also be applicable to forming the ONO structure in a floating gate FLASH device.

INDUSTRIAL APPLICABILITY

The present invention, by use of a process either to increase the oxygen content of a bottom oxide/substrate interface, or to form a bottom oxide having a super-stoichiometric oxygen content at the bottom oxide/substrate interface, a semiconductor device including an ONO structure may be fabricated without creation of interface states that could provide charge leakage paths from the charge storage layer of the ONO structure. The present invention provides advantages such as (1) formation of a bottom oxide/substrate interface with a higher oxygen content; (2) allowing selection of any of a number of different methods for increasing the oxygen content; (3) a lower thermal budget; and (4) formation of a sharper bottom oxide/substrate interface, resulting in fewer interface states that could provide charge leakage paths. Thus, the present invention provides an advance in ONO fabrication technology, and insures proper charge isolation in ONO structures used in MIRRORBIT™ two-bit EEPROM devices, while at the same time providing distinct process and economic advantages. Although described in terms of, and particularly applicable to, two-bit EEPROM devices, the present invention is broadly applicable to fabrication of any semiconductor device including an ONO structure.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the thicknesses of the individual layers making up the ONO structure can be varied from that described herein. It is therefore intended to include within the invention all such variations and modifications that fall within the scope of the appended claims and equivalents thereof.

What is claimed is:

1. A process for reducing charge leakage in a SONOS flash memory device, comprising:
    providing a semiconductor substrate;
    forming a bottom oxide layer of an ONO structure on a surface of the semiconductor substrate having an oxide/silicon interface with a super-stoichiometric oxygen content adjacent the oxide/silicon interface, wherein the super-stoichiometric oxygen content is in the bottom oxide layer as initially formed; and
    depositing a charge-storage layer on the bottom oxide layer.

2. The process of claim 1, wherein the bottom oxide layer having the super-stoichiometric oxygen content adjacent the oxide/silicon interface exhibits a reduced charge leakage relative to a bottom oxide layer having a sub-stoichiometric oxygen content adjacent the oxide/silicon interface.

3. The process of claim 1, wherein the step of forming the bottom oxide layer is carried out by decoupled plasma oxidation in an oxidizing atmosphere.

4. The process of claim 1, wherein the step of forming the bottom oxide layer is carried out by remote plasma oxidation in an oxidizing atmosphere.

5. The process of claim 1, wherein the step of forming the bottom oxide layer is carried out comprising ozone as an oxidizing agent.

6. The process of claim 5, further comprising an ozone pre-clean of the surface of the substrate.

7. The process of claim 1, wherein the step of forming the bottom oxide layer is carried out by an extended CVD or thermal oxidation at a temperature ranging from about 200° C. to about 600° C. in an oxidizing atmosphere, until the oxygen content of the bottom oxide layer becomes super-stoichiometric.

8. The process of claim 1, wherein the step of forming the bottom oxide layer is carried out by a combination of alternating thermal oxidation and HTO deposition.

9. The process of claim 1, wherein the step of forming the bottom oxide layer is carried out by radical oxidation.

10. The process of claim 1, wherein the charge storage layer comprises a nitride charge storage material.

11. The process of claim 1, wherein the bottom oxide layer comprises a high-K dielectric material.

12. The process of claim 1, wherein the charge storage layer comprises a high-K dielectric material.

13. A process for reducing charge leakage in a SONOS flash memory device, comprising:
    providing a semiconductor substrate;
    forming a bottom oxide layer of an ONO structure on a surface of the semiconductor substrate having an oxide/silicon interface with a super-stoichiometric oxygen content adjacent the oxide/silicon interface, wherein the super-stoichiometric oxygen content is in the bottom oxide layer as Initially formed and the bottom oxide layer having the super-stoichiometric oxygen content adjacent the oxide/silicon interface exhibits a reduced charge leakage relative to a bottom oxide layer having a sub-stoichiometric oxygen content adjacent the oxide/silicon interface; and
    depositing a nitride charge-storage layer on the bottom oxide layer.

14. The process of claim 13, wherein the step of forming the bottom oxide layer is carried out by decoupled plasma oxidation in an oxidizing atmosphere.

15. The process of claim 13, wherein the step of forming the bottom oxide layer is carried out by remote plasma oxidation in an oxidizing atmosphere.

16. The process of claim 13, wherein the step of forming the bottom oxide layer is carried out comprising ozone as an oxidizing agent.

17. The process of claim 16, further comprising an ozone pre-clean of the surface of the substrate.

18. The process of claim 13, wherein the step of forming the bottom oxide layer is carried out by an extended CVD or thermal oxidation at a temperature ranging from about 200° C. to about 600° C. in an oxidizing atmosphere, until the oxygen content of the bottom oxide layer becomes super-stoichiometric.

19. The process of claim 13, wherein the step of forming the bottom oxide layer is carried out by a combination of alternating thermal oxidation and HTO deposition.

20. The process of claim 13, wherein the step of forming the bottom oxide layer is carried out by radical oxidation.

21. The process of claim 13, wherein the bottom oxide layer comprises a high-K dielectric material.

* * * * *

UNITED STATES PATENT AND TRADEMARK OFFICE
CERTIFICATE OF CORRECTION

PATENT NO. : 7,033,957 B1
APPLICATION NO. : 10/358586
DATED : April 25, 2006
INVENTOR(S) : Shiraiwa et al.

It is certified that error appears in the above-identified patent and that said Letters Patent is hereby corrected as shown below:

Col. 6, ln. 58, replace "lead zirconate ($PbZro_3$)," with --lead zirconate ($PbZrO_3$),--.
Col. 16, ln. 29, replace "lead zirconate ($PbZro_3$)," with --lead zirconate ($PbZrO_3$),--.
Col. 16, ln. 55, replace "dichlorosilane ($SiC_{12}H_2$) or" with
--dichlorosilane ($SiCl_2H_2$) or--.
Col. 20 Claim 13, ln. 9, replace "as Initially formed" with --as initially formed--.

Signed and Sealed this

First Day of August, 2006

JON W. DUDAS
*Director of the United States Patent and Trademark Office*